United States Patent
Strang et al.

(10) Patent No.: US 7,582,186 B2
(45) Date of Patent: Sep. 1, 2009

(54) METHOD AND APPARATUS FOR AN IMPROVED FOCUS RING IN A PLASMA PROCESSING SYSTEM

(75) Inventors: Eric J. Strang, Chandler, AZ (US); Steven T. Fink, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 229 days.

(21) Appl. No.: 10/739,127

(22) Filed: Dec. 19, 2003

(65) Prior Publication Data

US 2004/0129226 A1  Jul. 8, 2004

Related U.S. Application Data

(60) Provisional application No. 60/434,673, filed on Dec. 20, 2002.

(51) Int. Cl.
C23C 16/00 (2006.01)
C23F 1/00 (2006.01)
H01L 21/306 (2006.01)

(52) U.S. Cl. .................. 156/345.51; 156/345.52; 156/345.53; 156/345.44; 156/345.55; 118/728; 118/729; 118/730

(58) Field of Classification Search .............. 118/728; 156/345.51, 915
See application file for complete search history.

(56) References Cited

U.S. PATENT DOCUMENTS

| | | | | |
|---|---|---|---|---|
| 5,431,737 A | * | 7/1995 | Keller et al. | 118/729 |
| 5,476,548 A | * | 12/1995 | Lei et al. | 118/729 |
| 5,676,205 A | * | 10/1997 | White | 165/275 |
| 5,919,332 A | * | 7/1999 | Koshiishi et al. | 156/345.47 |
| 6,475,336 B1 | * | 11/2002 | Hubacek | 156/345.51 |
| 6,589,352 B1 | * | 7/2003 | Yudovsky et al. | 118/729 |
| 6,795,292 B2 | * | 9/2004 | Grimard et al. | 361/234 |
| 2002/0029745 A1 | * | 3/2002 | Nagaiwa et al. | 118/723 E |
| 2005/0172904 A1 | * | 8/2005 | Koshimizu et al. | 118/728 |

FOREIGN PATENT DOCUMENTS

| | | | | |
|---|---|---|---|---|
| EP | 1106715 A | * | 6/2001 | |
| JP | 2000-36490 A | * | 2/2000 | |

* cited by examiner

*Primary Examiner*—Parviz Hassanzadeh
*Assistant Examiner*—Rakesh K Dhingra
(74) *Attorney, Agent, or Firm*—Oblon, Spivak, McClelland, Maier & Neustadt, P.C.

(57) ABSTRACT

A focus ring configured to be coupled to a substrate holder comprises a first surface exposed to a process; a second surface, opposite the first surface, for coupling to an upper surface of the substrate holder; an inner radial edge for facing a periphery of a substrate; and an outer radial edge. The second surface further comprises one or more contact features, each of which is configured to mate with one or more receiving features formed within the upper surface of the substrate holder. The focus ring can further comprise a clamping feature for mechanically clamping the focus ring to the substrate holder. Furthermore, a gas can be supplied to the contact space residing between the one or more contact features on the focus ring and the one or more receiving features on the substrate holder.

24 Claims, 13 Drawing Sheets

METHOD AND APPARATUS FOR AN IMPROVED FOCUS RING IN A PLASMA PROCESSING SYSTEM

CROSS-REFERENCE TO RELATED APPLICATIONS

This application claims priority to and is related to U.S. Provisional Application Ser. No. 60/434,673, filed on Dec. 20, 2002. The contents of this applications are incorporated herein by reference.

FIELD OF THE INVENTION

The present invention relates to an improved component for a plasma processing system and more particularly to a focus ring employed in a plasma processing system to surround a substrate.

BACKGROUND OF THE INVENTION

The fabrication of integrated circuits (IC) in the semiconductor industry typically employs plasma to create and assist surface chemistry within a plasma reactor necessary to remove material from and deposit material to a substrate. In general, plasma is formed within the plasma reactor under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

Although the formation of a population of charged species (ions, etc.) and chemically reactive species is necessary for performing the function of the plasma processing system (i.e. material etch, material deposition, etc.) at the substrate surface, other component surfaces on the interior of the processing chamber are exposed to the physically and chemically active plasma and, in time, can erode. The erosion of exposed components in the plasma processing system can lead to a gradual degradation of the plasma processing performance and ultimately to complete failure of the system.

In order to minimize the damage sustained by exposure to the processing plasma, a consumable or replaceable component, such as one fabricated from silicon, quartz, alumina, carbon, or silicon carbide, can be inserted within the processing chamber to protect the surfaces of more valuable components that would impose greater costs during frequent replacement. Furthermore, it is desirable to select surface materials that minimize the introduction of unwanted contaminants, impurities, etc. to the processing plasma and possibly to the devices formed on the substrate. Often times, these consumables or replaceable components are considered part of the process kit, which is frequently maintained during system cleaning.

SUMMARY OF THE INVENTION

An improved focus ring for a plasma processing system is described, wherein the design, fabrication, and implementation of the focus ring addresses several shortcomings.

A focus ring is described that is configured to surround a substrate on a substrate holder in a plasma processing system comprising: a first surface configured to face a process space in the processing system; a second surface, opposite the first surface, configured to be coupled to an upper surface of the substrate holder; an inner radial edge coupled to the first surface and the second surface; and an outer radial edge coupled to the first surface and the second surface. Furthermore, the second surface of the focus ring comprises one or more contact features coupled to the second surface and configured to mate with one or more receiving features coupled to the upper surface of the substrate holder.

Additionally, the focus ring can be coupled to the substrate holder using a clamping feature.

Additionally, the mating of the one or more contact features with the one or more receiving features forms a contact space, wherein the contact space is coupled to a gas supply.

BRIEF DESCRIPTION OF THE DRAWINGS

These and other advantages of the invention will become more apparent and more readily appreciated from the following detailed description of the exemplary embodiments of the invention taken in conjunction with the accompanying drawings, where.

DETAILED DESCRIPTION OF AN EMBODIMENT

Figure 1:
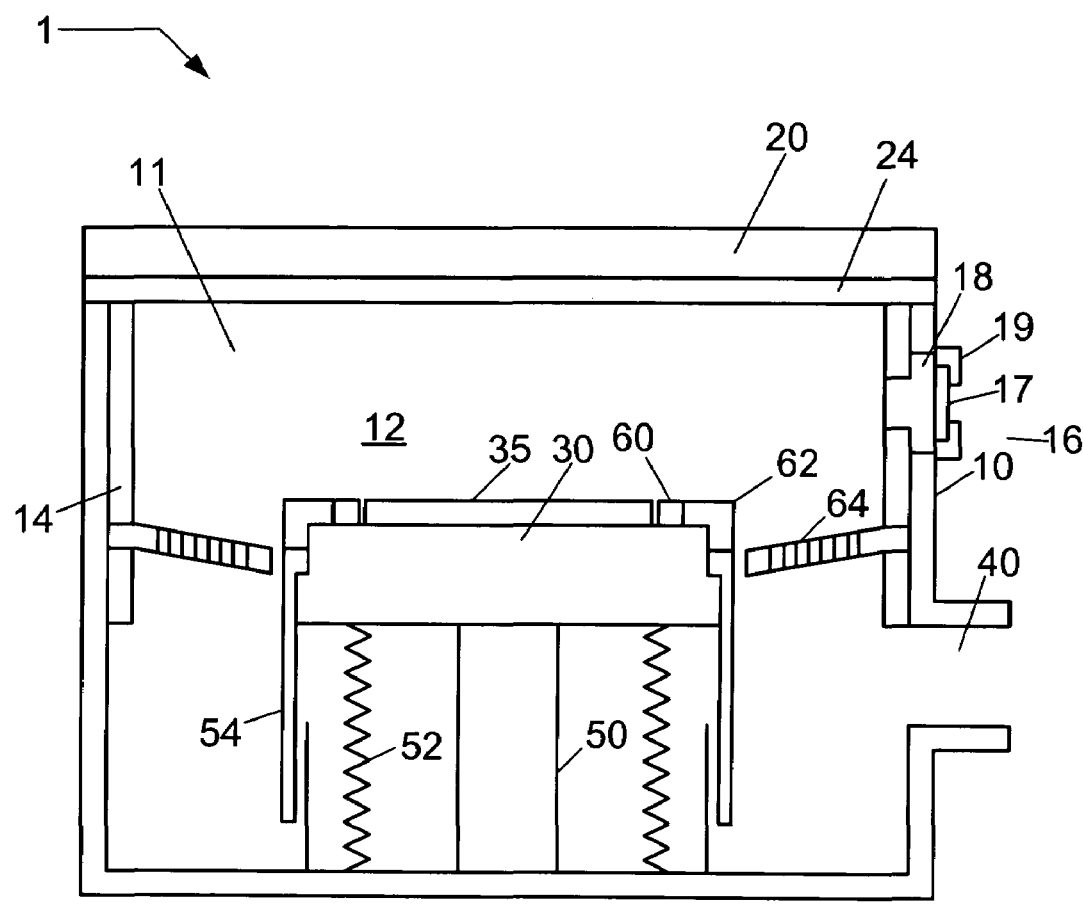
FIG. 1 illustrates a schematic block diagram of a plasma processing system according to an embodiment of the present invention.

A plasma processing system 1 is depicted in FIG. 1 comprising a processing chamber 10, an upper assembly 20, an upper wall 24, a substrate holder 30 for supporting a substrate 35, and a pumping duct 40 coupled to a vacuum pump (not shown) for providing a reduced pressure atmosphere 11 in processing chamber 10. Processing chamber 10 can, for example, facilitate the formation of a processing plasma in a process space 12 adjacent substrate 35. The plasma processing system 1 can be configured to process various substrates (i.e. 200 mm substrates, 300 mm substrates, or larger).

In the illustrated embodiment, upper assembly 20 can comprise at least one of a cover, a gas injection assembly, and an upper electrode impedance match network. For example, the upper wall 24 can, for example, be configured to comprise an electrode that is coupled to a radio frequency (RF) source, and therefore facilitate an upper electrode for the plasma processing system 1. In another alternate embodiment, the upper assembly 20 comprises a cover and an upper wall 24, wherein the upper wall 24 is maintained at an electrical potential equivalent to that of the processing chamber 10. For example, the processing chamber 10, the upper assembly 20, and the upper wall 24 can be electrically connected to ground potential, and facilitate a grounded wall for the plasma processing system 1.

Processing chamber 10 can, for example, further comprise a deposition shield 14 for protecting the plasma processing chamber 10 from the processing plasma in the process space 12, and an optical viewport 16. Optical viewport 16 can comprise an optical window 17 coupled to the backside of an optical window deposition shield 18, and an optical window flange 19 can be configured to couple optical window 17 to the optical window deposition shield 18. Sealing members, such as O-rings, can be provided between the optical window flange 19 and the optical window 17, between the optical window 17 and the optical window deposition shield 18, and between the optical window deposition shield 18 and the processing chamber 10. Optical window deposition shield 18 can extend through an opening 70 within deposition shield 14. Optical viewport 16 can, for example, permit monitoring of optical emission from the processing plasma in process space 12.

Substrate holder 30 can, for example, further comprise a vertical translational device 50 surrounded by a bellows 52 coupled to the substrate holder 30 and the processing chamber 10, and configured to seal the vertical translational device 50 from the reduced pressure atmosphere 11 in processing chamber 10. Additionally, a bellows shield 54 can, for example, be coupled to the substrate holder 30 and configured to protect the bellows 52 from a processing plasma. Substrate holder 10 can further be coupled to a focus ring 60, and, optionally, a shield ring 62. Furthermore, a baffle plate 64 can, for example, extend about a periphery of the substrate holder 30.

Substrate 35 can be, for example, transferred into and out of processing chamber 10 through a slot valve (not shown) and chamber feed-through (not shown) via robotic substrate transfer system where it is received by substrate lift pins (not shown) housed within substrate holder 30 and mechanically translated by devices housed therein. Once substrate 35 is received from the substrate transfer system, it is lowered to an upper surface of substrate holder 30.

Substrate 35 can be, for example, affixed to the substrate holder 30 via an electrostatic clamping system. Furthermore, substrate holder 30 can, for example, further include a cooling system including a re-circulating coolant flow that receives heat from substrate holder 30 and transfers heat to a heat exchanger system (not shown), or when heating, transfers heat from the heat exchanger system to substrate holder 30. Moreover, gas can, for example, be delivered to the back-side of substrate 35 via a backside gas system to improve the gas-gap thermal conductance between substrate 35 and substrate holder 30. Such a system can be utilized when temperature control of the substrate is required at elevated or reduced temperatures. In other embodiments, heating elements, such as resistive heating elements, or thermo-electric heaters/coolers can be included.

In the illustrated embodiment, shown in FIG. 1, substrate holder 30 can comprise an electrode through which RF power is coupled to the processing plasma in process space 12. For example, substrate holder 30 can be electrically biased at a RF voltage via the transmission of RF power from a RF generator (not shown) through an impedance match network (not shown) to substrate holder 30. The RF bias can serve to heat electrons to form and maintain plasma. In this configuration, the system can operate as a reactive ion etch (RIE) reactor, wherein the chamber and upper gas injection electrode serve as ground surfaces. A typical frequency for the RF bias can range from 1 MHz to 100 MHz, for example, 13.56 MHz. RF systems for plasma processing are well known to those skilled in the art.

Alternately, the processing plasma formed in process space 12 can be formed using a parallel-plate, capacitively coupled plasma (CCP) source, an inductively coupled plasma (ICP) source, transformer coupled plasma (TCP) source, any combination thereof, and with and without DC magnet systems. Alternately, the processing plasma in process space 12 can be formed using electron cyclotron resonance (ECR). In yet another embodiment, the processing plasma in process space 12 is formed from the launching of a Helicon wave. In yet another embodiment, the processing plasma in process space 12 is formed from a propagating surface wave.

Figure 2:
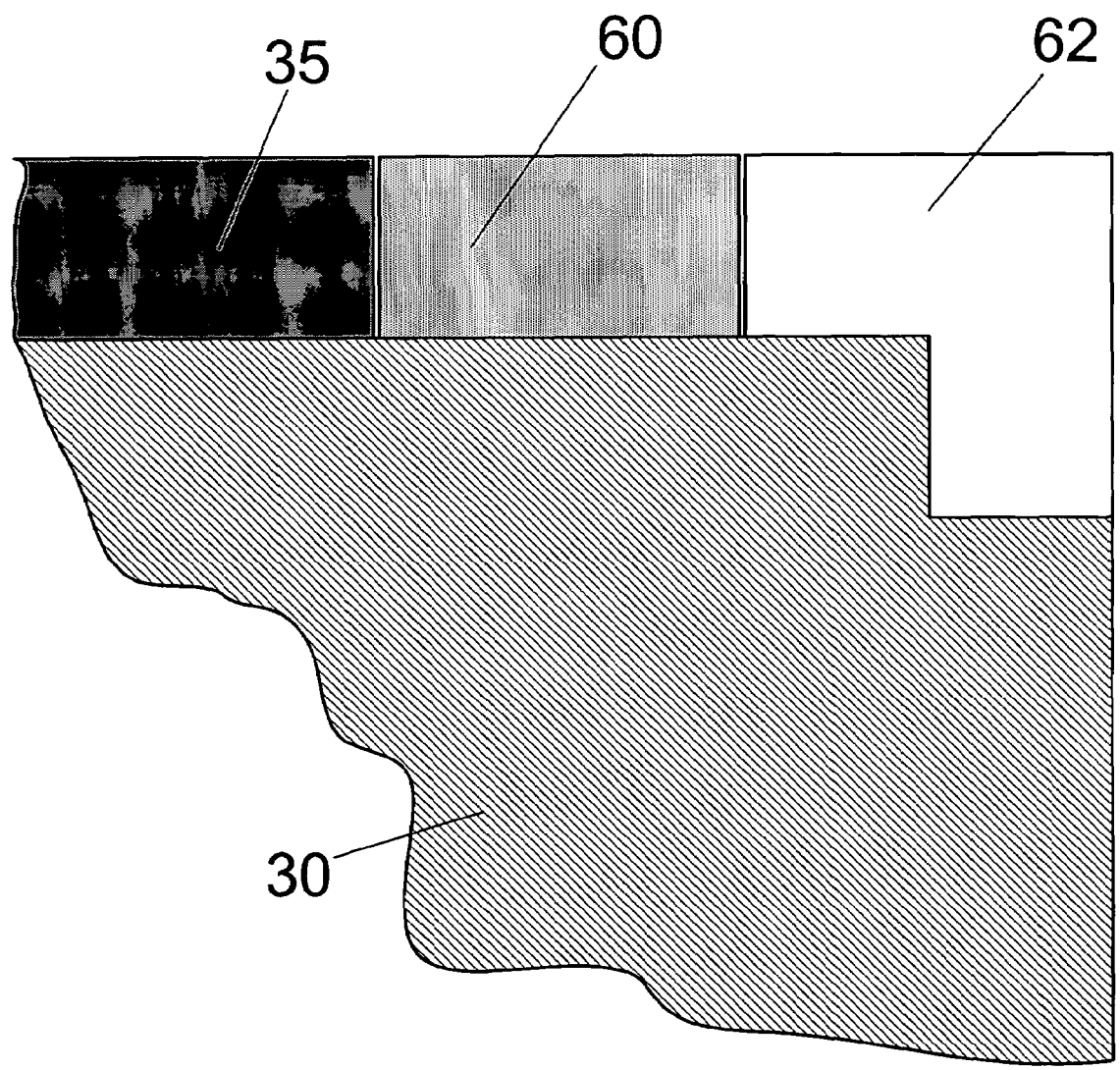
FIG. 2 presents an expanded cross-sectional view of a portion of a conventional substrate holder in a plasma processing system as shown in FIG. 1.

In FIG. 2, an expanded cross-sectional view of a portion of substrate holder 30 is shown. As depicted in FIG. 1, substrate holder 30 is configured to support substrate 35, and it is further configured to comprise focus ring 60 and, optionally, shield ring 62. In general, focus ring 60 can, for example, comprise one of silicon, silicon carbide, or carbon for silicon processing. Additionally, shield ring 62 can, for example, comprise one of silicon dioxide (or quartz), or alumina (or sapphire) for silicon processing. Both components, i.e. focus ring 60 and shield ring 62, are typically partially consumed during processing and, in many cases, they are replaced frequently (i.e. during scheduled intervals). In general, focus ring 60 and shield ring 62 rest atop substrate holder 30 without fasteners.

Figure 3:
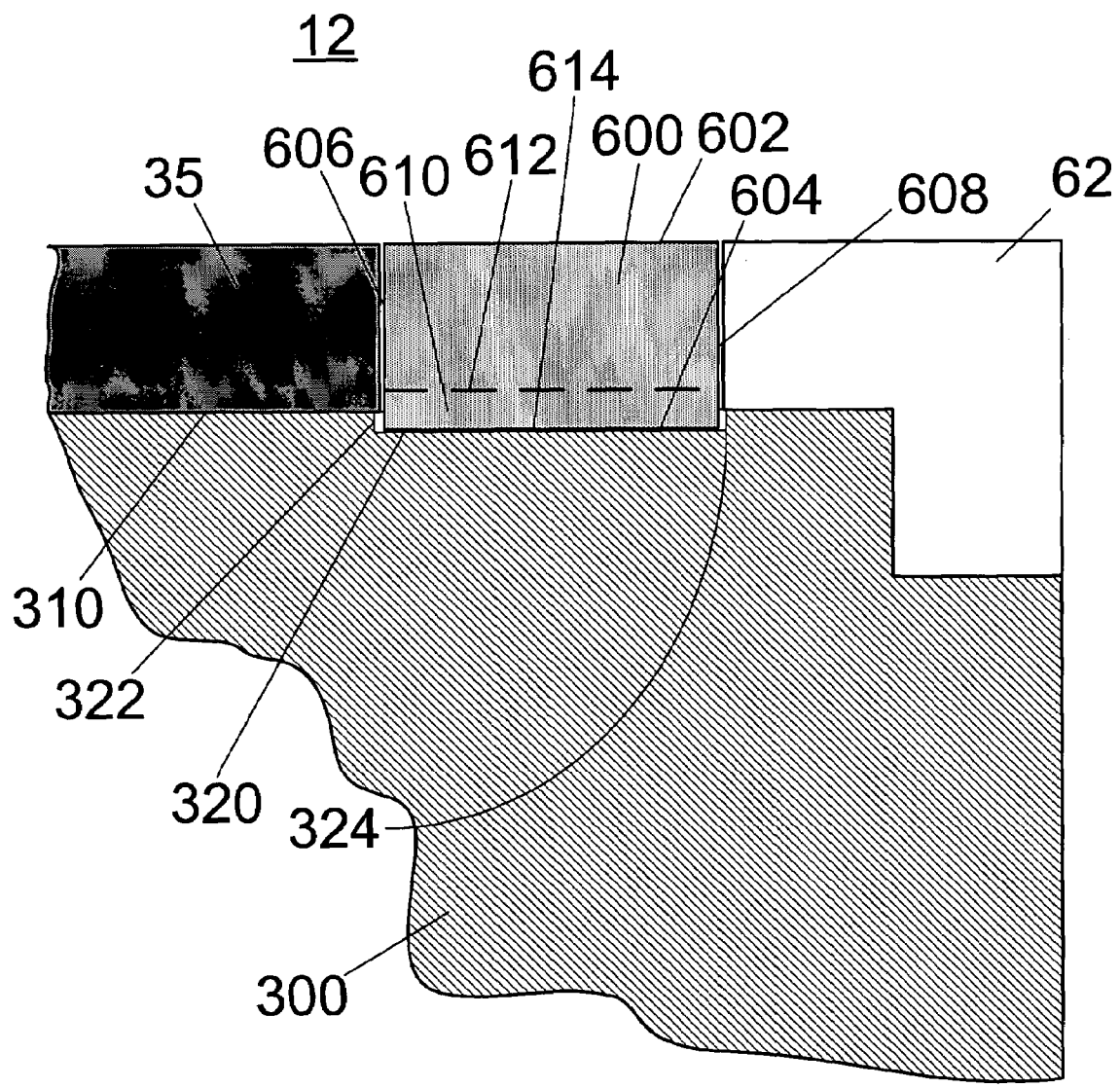
FIG. 3 presents an expanded cross-sectional view of a portion of a substrate holder for a plasma processing system according to an embodiment of the present invention.

Referring now to FIG. 3, an expanded cross-sectional view of a portion of substrate holder 30 is shown comprising a focus ring 600 with improved coupling between the focus ring 600 and substrate holder 300. Focus ring 600 comprises a first surface 602 facing process space 12; a second surface 604, opposite the first surface 602; an inner radial edge 606 coupled to first surface 602 and second surface 604; and an outer radial edge 608 coupled to first surface 602 and second surface 604. The second surface 604 further comprises one or more contact features 610, each of which is aligned to couple with one or more receiving features 320 formed within an upper surface 310 of the substrate holder 300.

Figure 4:
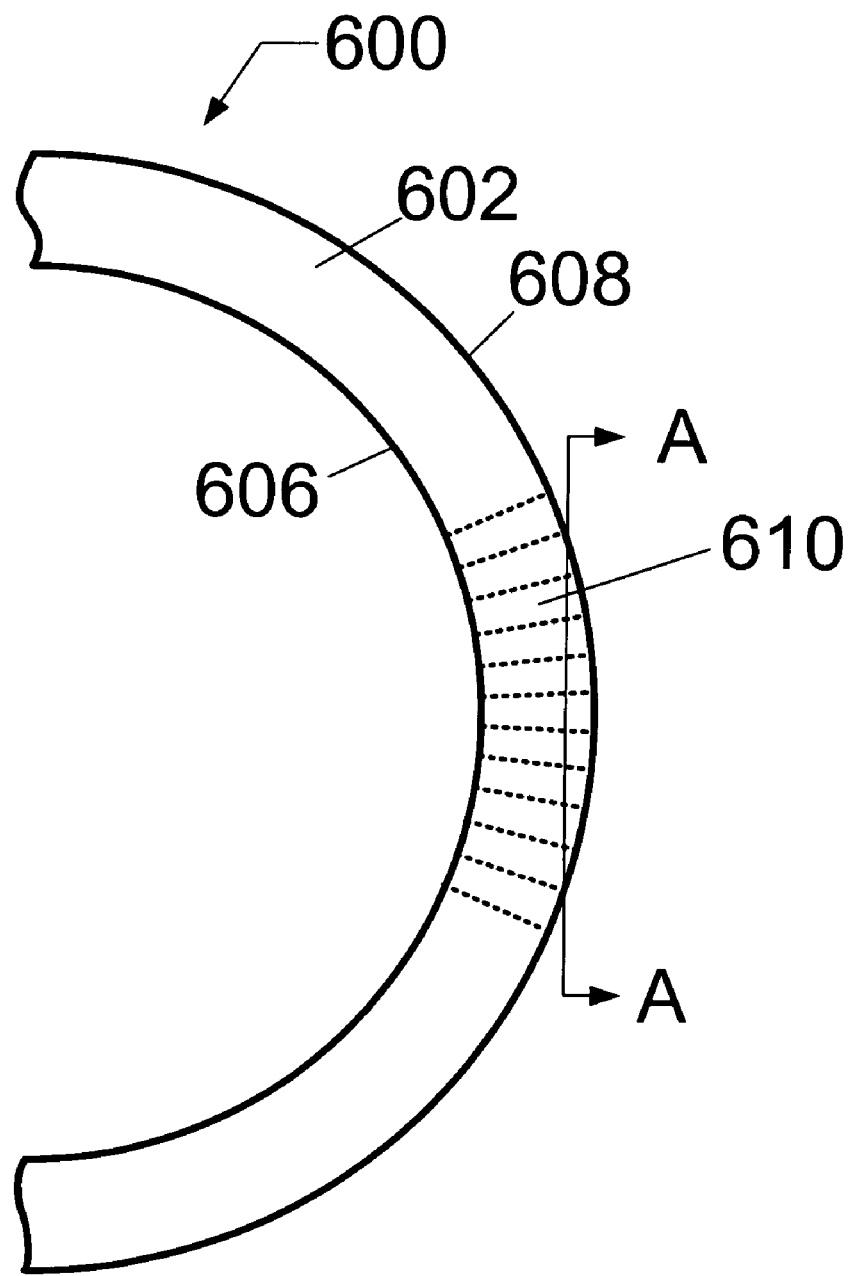
FIG. 4 shows a partial plan view of a focus ring according to another embodiment of the present invention.
Figure 5A:
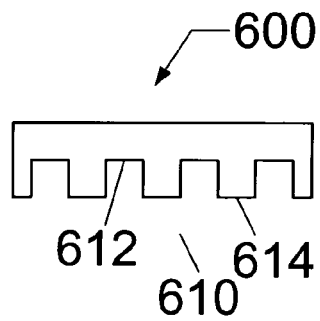
FIG. 5A shows a cross-sectional view of a focus ring along section A-A of FIG. 4 according to another embodiment of the present invention.
Figure 5B:
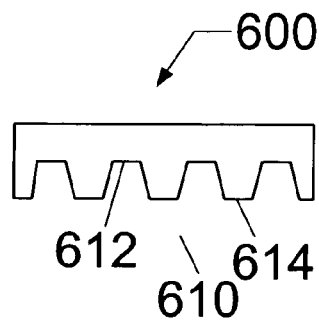
FIG. 5B shows a cross-sectional view of a focus ring along section A-A of FIG. 4 according to another embodiment of the present invention.
Figure 5C:
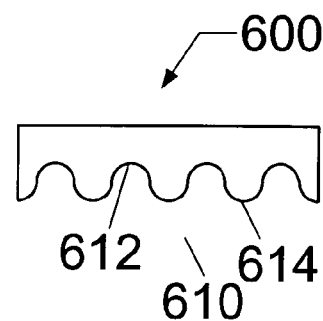
FIG. 5C shows a cross-sectional view of a focus ring along section A-A of FIG. 4 according to another embodiment of the present invention.

The one or more contact features 610 can, for example, comprise radially extending grooves as shown in plan view in FIG. 4, and in several exemplary cross-sectional views in FIGS. 5A, 5B, and 5C. Alternately, the one or more contact features 610 can extend in an azimuthal direction. In an alternate embodiment, the one or more contact features 610 can be slanted and, therefore, extend partially in a radial direction and an azimuthal direction. In an alternate embodiment, the one or more contact features 610 can comprise a combination of alignment methodologies thereof. As depicted in FIGS. 3, 5A, 5B, and 5C, each contact feature 610 can extend vertically between a trough surface 612 and a ridge surface 614. The distance between the trough surface 612 and ridge surface 614 can be constant along the length of the contact feature 610. Alternately, the aforementioned distance can be variable along the length of each contact feature 610, either linearly varying or non-linearly varying. Furthermore, each contact feature 610 may or may not extend entirely between the inner radial edge 606, and the outer radial edge 608. As shown in FIGS. 5A, 5B, and 5C, the one or more contact features 610 can, for example, comprise a square cross-section, a trapezoidal cross-section, or a curved cross-section. Other geometries are possible as well, such as triangular, circular, etc.

Similarly, as shown in FIG. 3, substrate holder 300 comprises one or more receiving features 320 formed in upper surface 310, wherein each receiving feature 320 comprises trough and ridge surfaces (not shown) to couple with the respective one or more contact features 610 of focus ring 600. Alternately, the one or more receiving features 320 comprises a single channel surface, either coincident with upper surface 310 or not coincident with upper surface 310, to receive the one or more contact features 610 of focus ring 600. Also shown in FIG. 3, the one or more receiving features 320 can comprise at least one of an inner clearance space 322, and an outer clearance space 324 in order to provide adequate clearance for differential expansion or contraction of the focus ring 600 relative to the substrate holder 300 due to potentially differing temperature variations and differing coefficients of thermal expansion between the two respective components.

The implementation of one or more contact features 610 in the second surface 604 of the focus ring 600 can increase the effective surface area of the second surface 604 that is coupled to the upper surface 310 of substrate holder 300. For example, if the azimuthal spacing of the one or more contact features 610 is such that the width of each contact feature 610 is approximately equivalent to the depth of each contact feature 610, then the surface area of the second surface 604 of focus ring 600 coupled to the upper surface 310 of substrate holder 300 is increased by approximately a factor of two. Since the effective surface area is increased, the effective contact is increased, hence, manifesting, for example, as an improved thermal contact. For instance, during plasma processing, it is not uncommon for a focus ring to reach an elevated temperature (e.g. 200 to 300 C.) relative to the temperature of the substrate holder (e.g. 20 to 80 C.). And, for instance, during plasma processing, it is not uncommon for an elevated focus ring temperature to affect the processing results at the periphery of the substrate. Therefore, for example, an increase in the effective contact between the focus ring 600 and the substrate holder 300 can lead to an increase in the thermal transfer between the two aforesaid components, and, hence, a reduction in the temperature of the focus ring 600.

Focus ring 600 can, for example, comprise one of silicon, silicon carbide, silicon nitride, or carbon for silicon processing. Additionally, focus ring 600 can be fabricated using at least one of machining, polishing, and grinding. For example, a focus ring with one or more contact features described above can be machined according to specifications set forth on a mechanical drawing, using conventional techniques including a mill, etc. The techniques for machining a component using, for example, a mill, are well known to those skilled in the art of machining such materials.

Figure 6A:
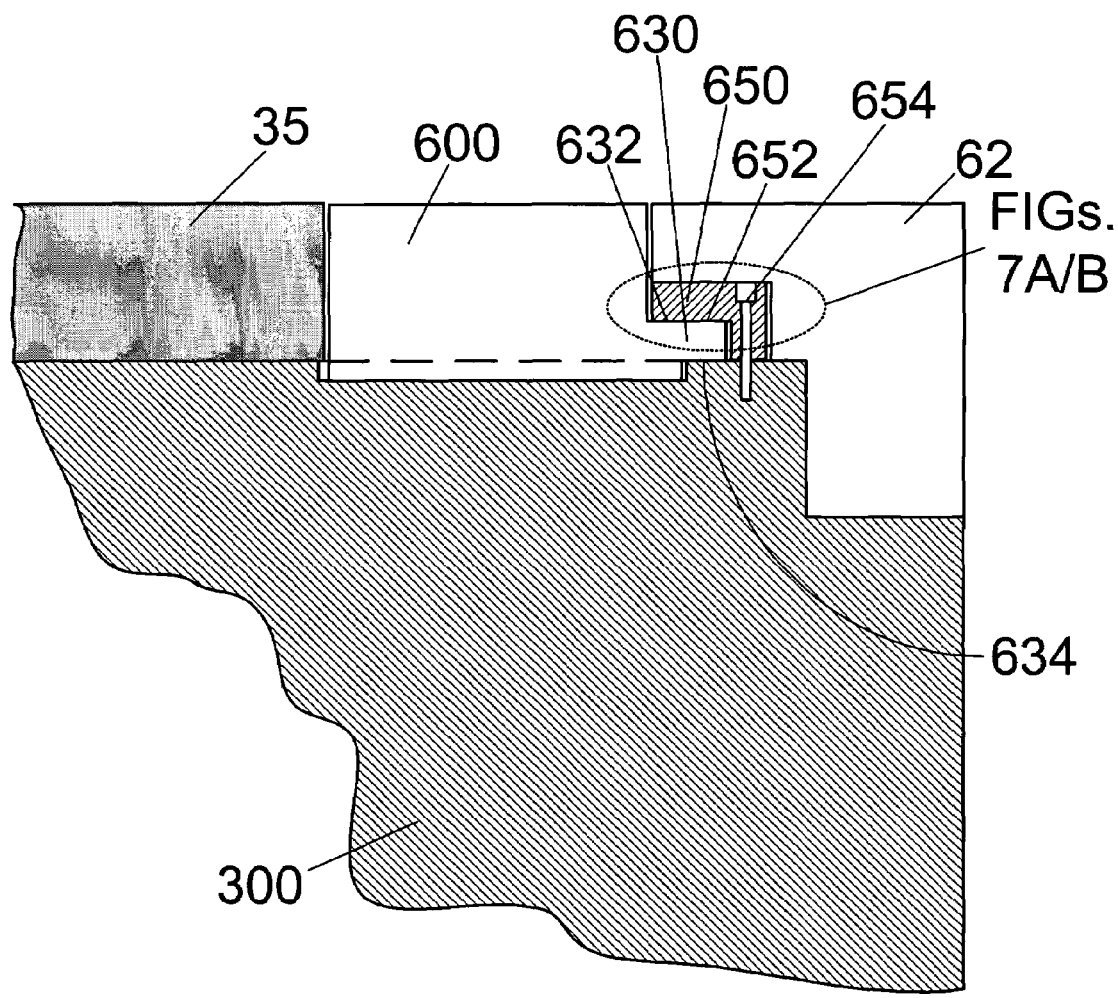
FIG. 6A presents an expanded cross-sectional view of a portion of a substrate holder for a plasma processing system according to another embodiment of the present invention.
Figure 6B:
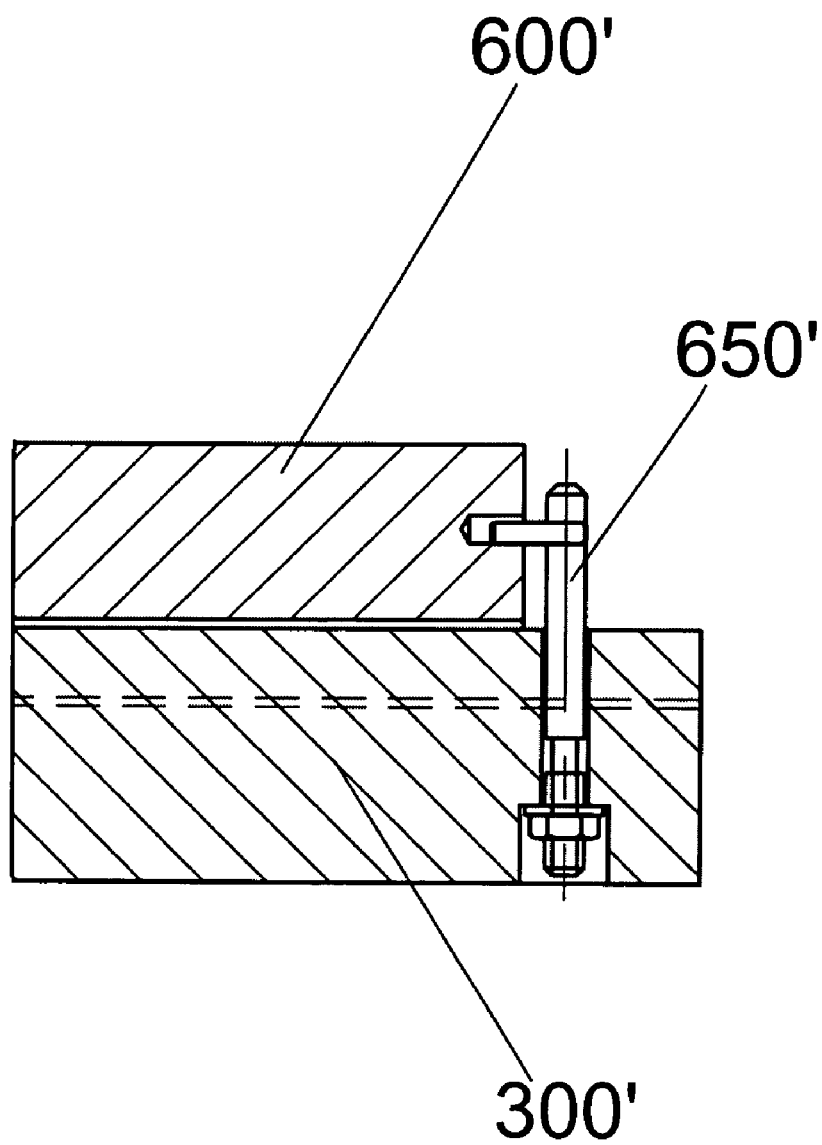
FIG. 6B presents an expanded cross-sectional view of a portion of a substrate holder for a plasma processing system according to another embodiment of the present invention.
Figure 6C:
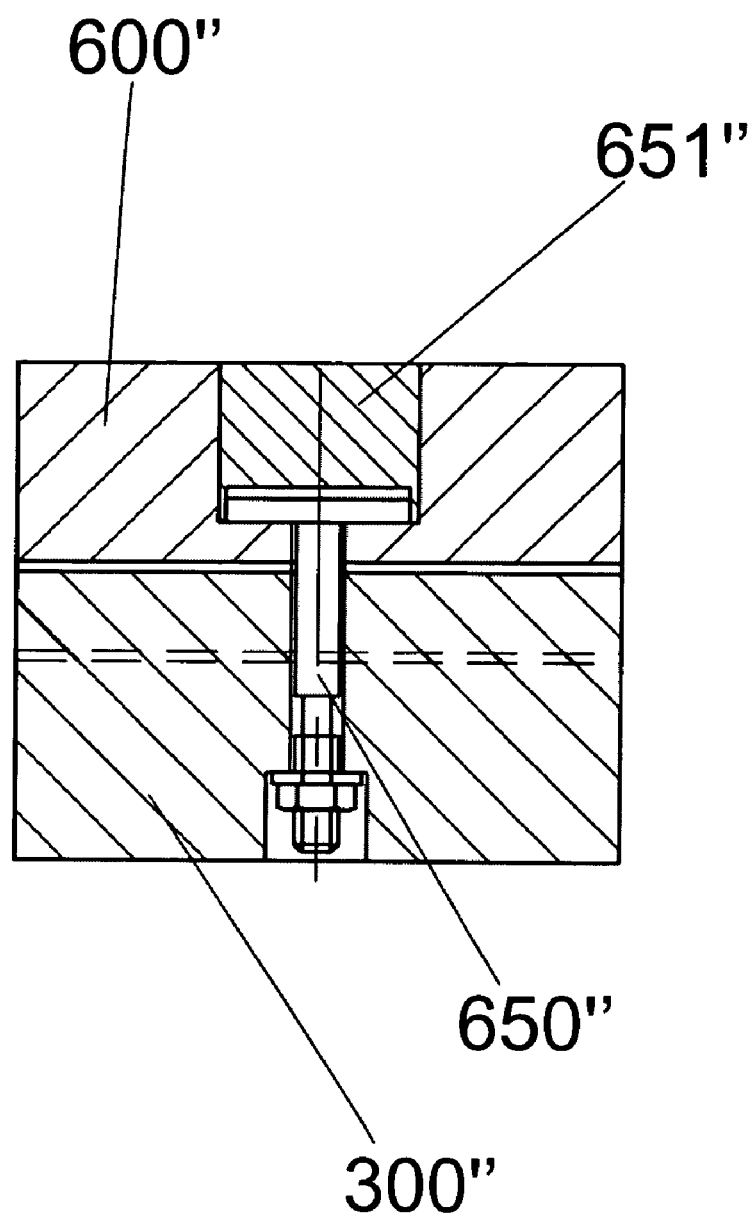
FIG. 6C presents an expanded cross-sectional view of a portion of a substrate holder for a plasma processing system according to another embodiment of the present invention.

In an alternate embodiment, as shown in FIG. 6A, focus ring 600 can further comprise a mating lip 630 with an upper mating surface 632 and a lower mating surface 634, wherein focus ring 600 can be mechanically clamped to substrate holder 300 by asserting mechanical pressure at the upper mating surface 632. A clamping fixture 650 comprises a clamping surface 652 and a fastening receptor 654 configured to receive a fastening device (not shown). The clamping fixture 650 mechanically couples the focus ring 600 to the substrate holder 300 through the action of mechanical pressure coupled between the clamping surface 652 of the clamping fixture 650 and the upper mating surface 632 of focus ring 600 during the fastening of the clamping fixture 650 to the substrate holder with one or more fastening devices (not shown). The clamping fixture 650 can, for example, comprise Teflon, high temperature plastic, ceramic, silicon, silicon carbide, carbon, and anodized aluminum. Alternately, as shown in FIG. 6B, a focus ring 600' can be mechanically clamped to a substrate holder 300' using a post clamping fixture 650' as illustrated. Alternately, as shown in FIG. 6C, a focus ring 600" can be mechanically clamped to a substrate holder 300" using a clamping fixture 650" with a cover 651" as illustrated. The cover 651" can, for example, be fabricated from materials similar to that of focus ring 600".

Figure 7A:
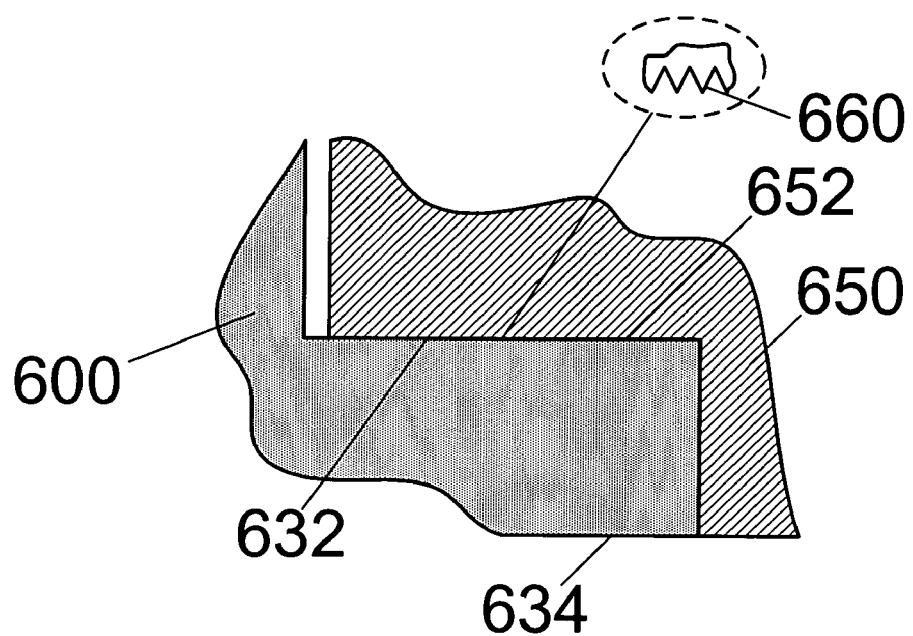
FIG. 7A shows an expanded cross-sectional view of a clamping surface shown in FIG. 6A according to an embodiment of the present invention.
Figure 7B:
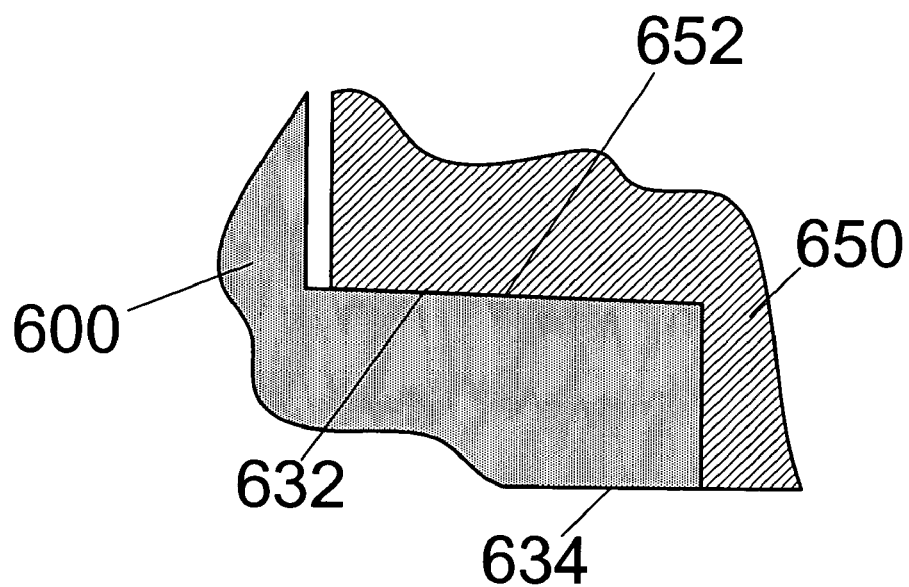
FIG. 7B shows an expanded cross-sectional view of a clamping surface shown in FIG. 6A according to another embodiment of the present invention.

Referring now to FIGS. 6A, 7A, and 7B, the clamping surface 652 and the upper mating surface 632 can be flat or horizontal as shown in FIG. 6, or inclined or declined as shown in FIG. 7B. Alternately, the clamping surface 652 can be grooved, wherein grooves 660 extend radially, azimuthally, or a combination thereof. With the implementation of grooves 660 in clamping surface 652, mechanical pressure is coupled between the clamping surface 652 and the mating surface 632; however, the physical contact area is substantially reduced, and, hence, the respective coupling is more amenable to slipping in order to accommodate differing thermal expansions of the various components described in FIGS. 3 and 6.

Figure 8A:
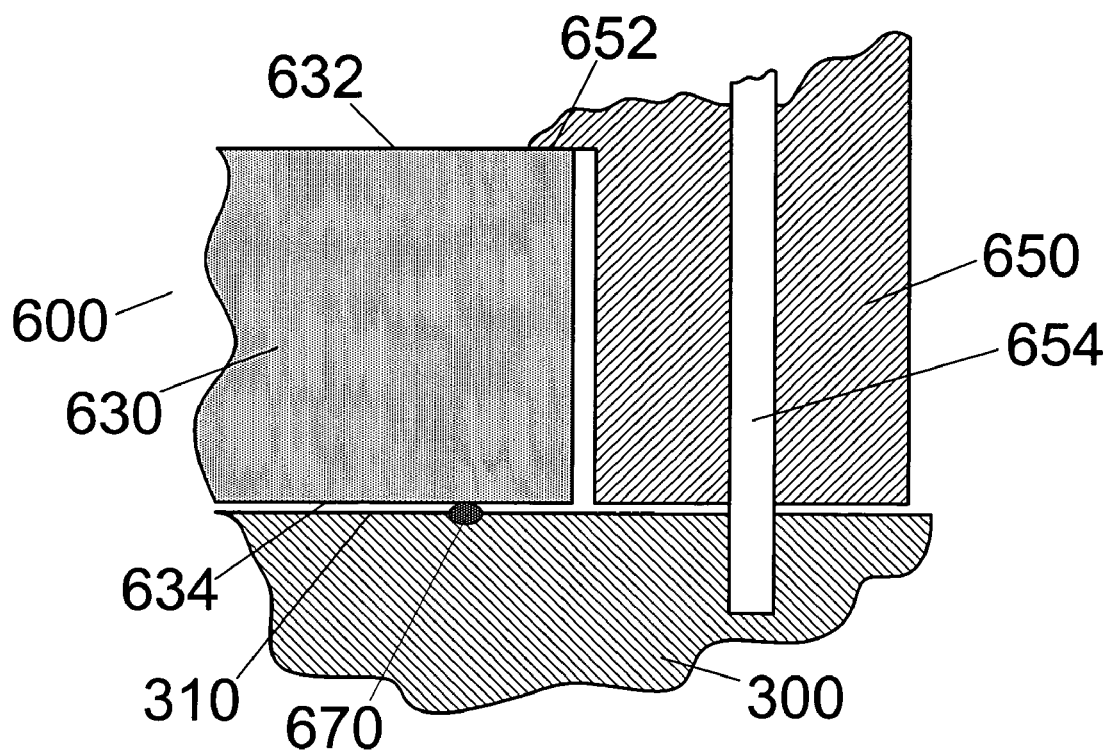
FIG. 8A shows an expanded cross-sectional view of a mating surface shown in FIG. 6A according to an embodiment of the present invention.
Figure 8B:
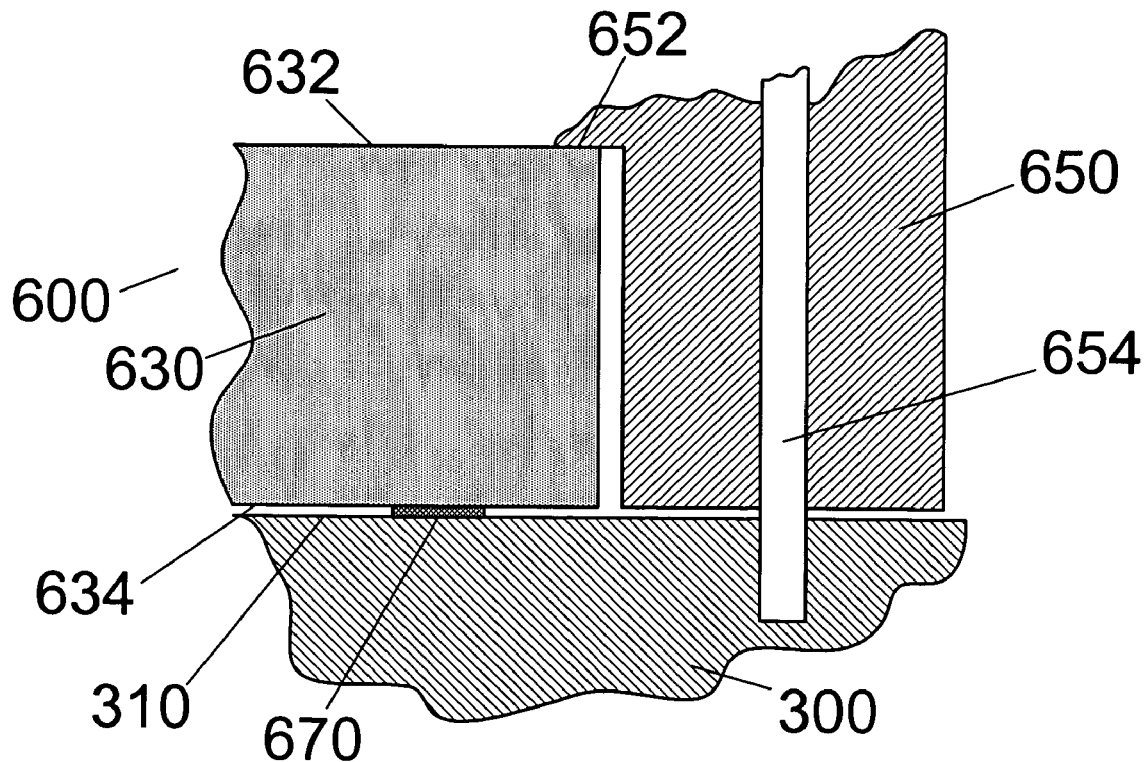
FIG. 8B shows an expanded cross-sectional view of a mating surface shown in FIG. 6A according to another embodiment of the present invention.

In an alternate embodiment, the upper surface 310 of substrate holder 300 in contact with the lower mating surface 634 of focus ring 600 can further comprise a compliant element 670. Compliant element 670 can, for example, comprise an O-ring seal (e.g. elastomer seal) configured to be received in an O-ring groove (not shown) formed in upper surface 310 of substrate holder 300 as shown in FIG. 8A, or a thin ring of Teflon as shown in FIG. 8B. For example, O-ring groove (not shown) can comprise a dovetail cross-section or rectangular cross-section configured for receiving an O-ring. In an alternate embodiment, an electrical coupling feature (not shown) can be integrated with the O-ring groove (or a separate groove) in order to provide improved electrical coupling between the focus ring 600 and the substrate holder 300. The electrical coupling feature can, for example, comprise Spirashield (commercially available from Spira Manufacturing Company), known to those skilled in the art of vacuum processing. The insertion of compliant element 670 between the lower mating surface 634 and the upper surface 310 can, for example, reduce the probability for fracture of focus ring 600 during clamping.

Figure 9:
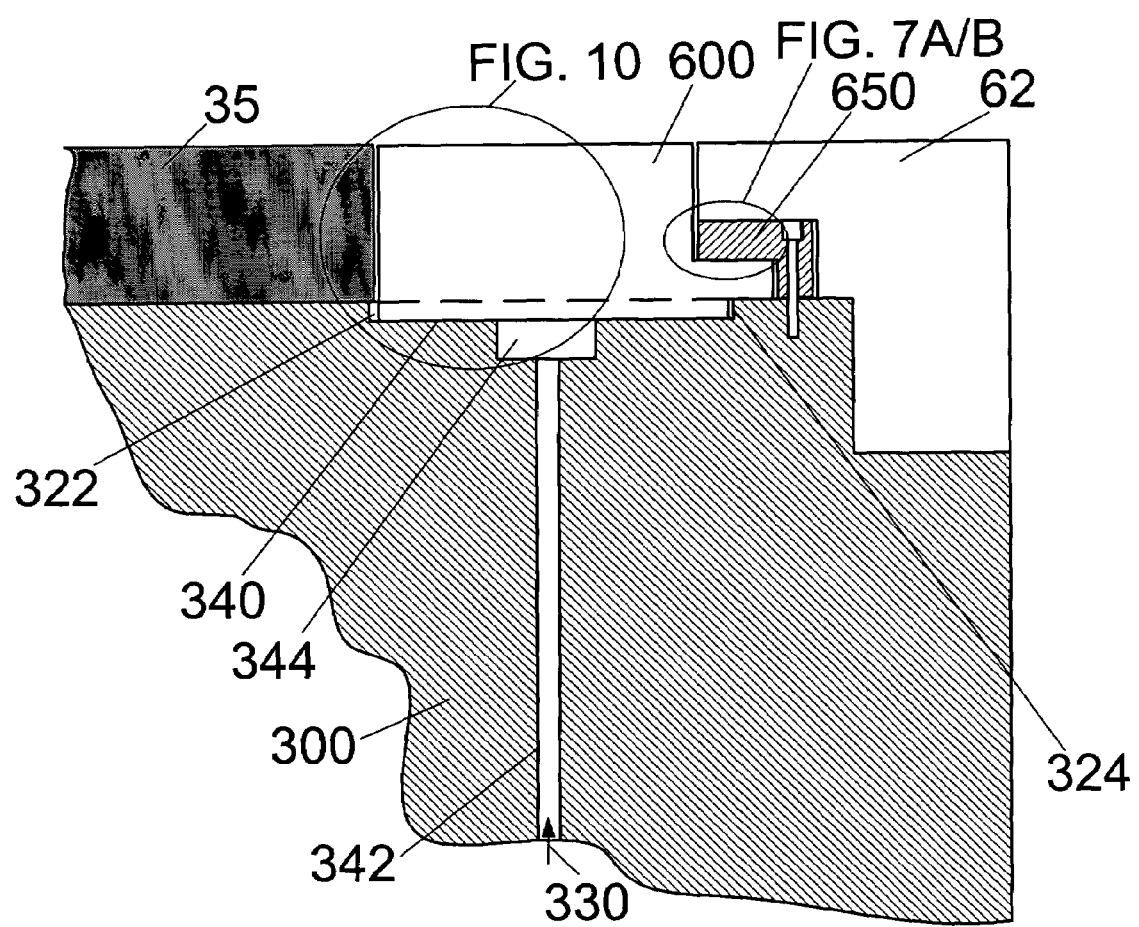
FIG. 9 presents an expanded cross-sectional view of a portion of a substrate holder for a plasma processing system according to another embodiment of the present invention.
Figure 10:
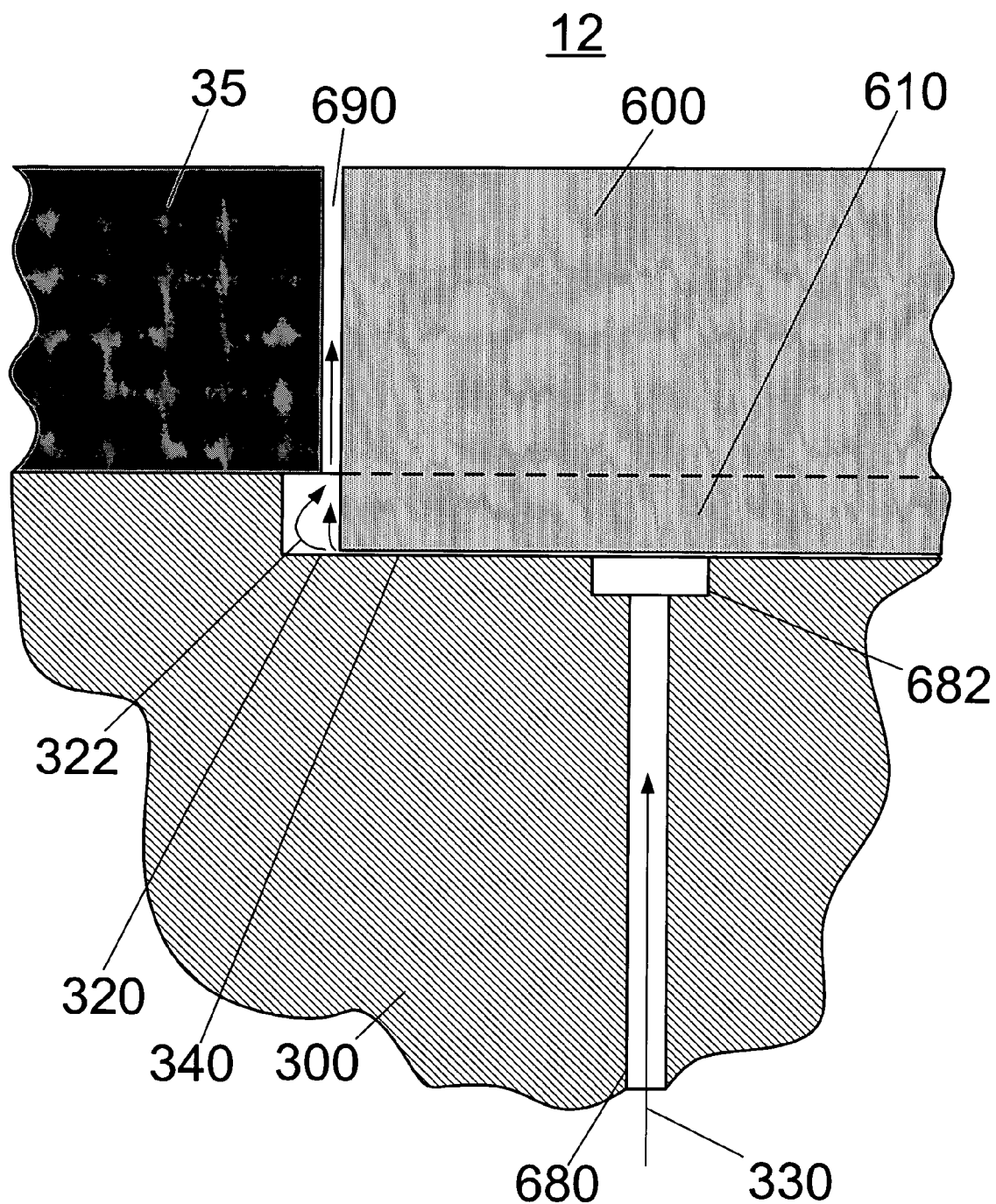
FIG. 10 shows an expanded cross-sectional view of a portion of the substrate holder shown in FIG. 9.

In alternate embodiment, FIG. 9 depicts the coupling of a gas 330 to a contact space 340 residing between the one or more contact features 610 of focus ring 600 and the one or more receiving features 320 of substrate holder 300. Gas 330 is supplied to contact space 340 by coupling a gas line 342 to a gas distribution channel 344, which is, in turn, coupled to one or more receiving features 320 of the substrate holder 300. As shown in FIG. 10, gas 330 fills contact space 340, and leaks to the inner clearance space 322 and outer clearance space 324, and, for example, through the clearance gap 690 between the outer periphery of substrate 35 and the inner radial edge 606 of focus ring 600. Gas 330 can comprise an inert gas such as a Nobel gas (i.e. He, Ar, Xe, Kr, etc.), $O_2$, $N_2$, a processing gas such as argon, $CF_4$ and $O_2$, or argon, $C_4F_8$ and $O_2$ for oxide etch applications, or other chemistries such as $O_2/CO/Ar/C_4F_8$, $O_2/Ar/C_4F_8$, $O_2/CO/Ar/C_5F_8$, $O_2/CO/Ar/C_4F_6$, $O_2/Ar/C_4F_6$, $N_2/H_2$, and $N_2/O_2$. The presence of gas 330 in contact space 340 can, for example, improve the contact between focus ring 600 and substrate holder 300. For instance, during vacuum processing, the processing pressure can be less than 100 mTorr, which, in turn, can lead to poor thermal conductance between focus ring 600 and substrate holder 300 through contact space 340. By supplying gas 330 to contact space 340 as described above, the gas-gap pressure can be significantly increased (e.g. up to several Torr, such as 1 to 50 Torr, or more) and, hence, the thermal contact between the focus ring 600 and the substrate holder 300 can be dramatically improved.

When the supply of gas 330 to contact space 340 is used in conjunction with the clamping feature 650 depicted in FIGS. 6, 7A, and 7B, the contact between focus ring 600 and substrate holder 300 can be further improved due to the ability to achieve a higher gas pressure in contact space 340 for an equivalent leak mass flow rate of gas 330.

When the supply of gas 330 to contact space 340 is further used in conjunction with the compliant element 670 depicted in FIGS. 8A and 8B, the compliant element 670 can serve as a sealing member and, hence, affect the direction of migration for the gas 330 (shown in FIGS. 9 and 10) supplied to contact space 340 (shown in FIGS. 9 and 10). For example, in the configuration depicted in FIGS. 8A and 8B, gas 330 flows towards the inner radial edge 606 of focus ring 600 to clearance space 322, and eventually leaks through clearance gap 690 into process space 12. The flow of gas 330 through clearance gap 690 can, for example, aid in the prevention of the deposition of process materials in process space 12 on the backside of substrate 35.

Figure 11:
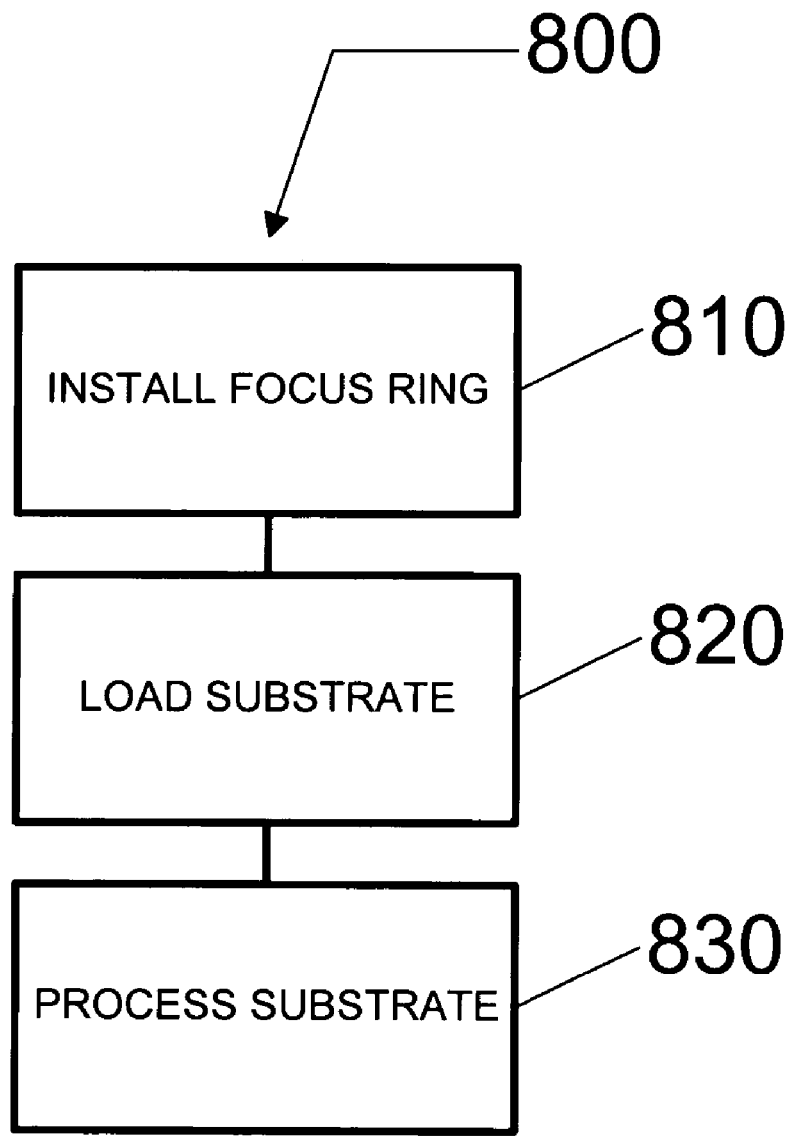
FIG. 11 presents a method of using a focus ring in a plasma processing system according to an embodiment of the present invention.

Referring now to FIG. 11, a method of using a focus ring to surround a substrate on a substrate holder in a plasma processing system is described. The method is presented in flow chart 800 beginning with step 810, wherein a focus ring such as one described in FIGS. 3 through 10 is installed in a plasma processing system such as the one described in FIG. 1. The installation can take place during the initial installation of the plasma processing system in a manufacturing environment or anytime thereafter by anyone skilled in the assembly and maintenance of such systems. For example, the focus ring can be installed, thereby replacing a previously used focus ring, during maintenance intervals, such as for chamber cleaning, process kit replacement, etc. During installation, the focus ring can rest atop an upper surface of the substrate holder. Alternately, the focus ring is clamped to the substrate holder using either a mechanical clamping system (FIGS. 6, 7A, 7B, 8A, and 8B), or an electrical clamping system as known to those skilled in the art of electrostatic clamping systems. Alternately, a compliant member can be installed between the focus ring and the upper surface of the substrate holder. Alternately, a gas can be supplied to a contact space (FIGS. 9 and 10) between the focus ring and the substrate holder.

In step 820, a substrate is loaded into the plasma processing system using techniques known to those skilled in the design of substrate transfer systems. In step 830, the substrate is processed in the plasma processing system. The processing of the substrate can, for example, comprise material processing including either the addition of material to the substrate or the removal of material from the substrate. During processing, the method can, for example, further comprise flowing a gas between the focus ring and the substrate holder.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A focus ring configured to surround a substrate on a substrate holder in a processing system comprising:
   a first surface configured to face a process space in said processing system;
   a second surface, opposite said first surface, configured to contact and be coupled to an upper surface of said substrate holder;
   an inner radial edge coupled to said first surface and said second surface;
   an outer radial edge coupled to said first surface and said second surface;
   a plurality of contact features that include projections and grooves, are formed continuously on the second surface and are configured to couple with a respective plurality of receiving features that include projections and grooves coupled to the upper surface of said substrate holder, wherein each of the projections and grooves of the focus ring couple with corresponding projections and grooves of the substrate holder; and
   a mating lip, said mating lip including an upper mating surface and a lower mating surface, the lower mating surface configured to engage with a first portion of the upper surface of said substrate holder, the first portion formed on a plane above the remainder of the upper surface of the substrate holder,
   wherein said focus ring is coupled to said substrate holder using a clamping feature, wherein the clamping feature is different from the contact features and a lower surface of the clamping feature is configured to engage with the upper surface of the mating lip, the upper surface of the mating lip being formed on a plane lower than the first surface facing the process space,
   wherein the focus ring is substantially circular in shape, and
   wherein the entire second surface of the focus ring contacts the upper surface of the substrate holder.

2. The focus ring as recited in claim 1, wherein said one or more contact features comprises at least one of a radially extending groove in said second surface and an azimuthally extending groove in said second surface.

3. The focus ring as recited in claim 2, wherein a cross-section of each of the one or more contact features comprises at least one of a square shape, a rectangular shape, a trapezoidal shape, a triangular shape, and a curved shape.

4. The focus ring as recited in claim 1, wherein said clamping feature comprises a clamping surface configured to be coupled to said upper mating surface, and a fastening receptor configured to receive a fastening device and configured to couple said clamping feature to said substrate holder.

5. The focus ring as recited in claim 4, wherein said upper mating surface and said clamping surface are at least one of vertical, horizontal, inclined, and declined surfaces.

6. The focus ring as recited in claim 4, wherein said clamping surface further comprises a groove, said groove comprising at least one of a radially extending groove and an azimuthally extending groove.

7. The focus ring as recited in claim 1, wherein said upper surface of said substrate holder further comprises a compliant member, said compliant member being coupled to said lower surface of said mating lip of said focus ring and said upper surface of said substrate holder.

8. The focus ring as recited in claim 7, wherein said compliant element comprises at least one of an elastomer O-ring and a thin Teflon ring.

9. The focus ring as recited in claim 1, wherein said coupling of said one or more contact features with said one or more receiving features forms a contact space, said contact space being coupled to a gas supply.

10. The focus ring as recited in claim 9, wherein said coupling to said gas supply comprises a gas line coupled to a gas distribution channel, said gas distribution channel being coupled to said contact space through said one or more receiving features.

11. The focus ring as recited in claim 1, wherein the projections and grooves extend between the inner radial edge and the outer radial edge.

12. The focus ring as recited in claim 11, wherein one or more of the projections and grooves extends only partially between the inner radial edge and outer radial edge.

13. The focus ring as recited in claim 1, wherein a height of the projections varies between one or more of the projections.

14. The focus ring as recited in claim 1, wherein clearance spaces are formed by an area adjacent each of the inner and outer radial edges, a bottom surface of the substrate and an upper surface of the substrate holder in order to allow for thermal expansion of the focus ring.

15. A processing system for processing a substrate comprising:
a substrate holder comprising an upper surface, wherein the upper surface comprises a plurality of receiving features;
a focus ring coupled to said substrate holder, said focus ring comprising a first surface configured to face a process space in said processing system; a second surface, opposite said first surface, configured to contact and be coupled to said upper surface of said substrate holder; an inner radial edge coupled to said first surface and said second surface; an outer radial edge coupled to said first surface and said second surface; and a plurality of contact features formed continuously on the second surface that include projections and grooves, are configured to couple with a respective plurality of receiving features that include projections and grooves, wherein each of the projections and grooves of the focus ring couple with corresponding projections and grooves of the substrate holder; and
a mating lip, said mating lip including an upper mating surface and a lower mating surface, the lower mating surface configured to engage with a first portion of the upper surface of said substrate holder, the first portion being formed on a plane above the remainder of the substrate holder,
wherein said focus ring is coupled to said substrate holder using a clamping feature, wherein the clamping feature is different from the contact features, a lower surface of the clamping feature is with the upper surface of the mating lip, the upper surface of the mating lip being formed on a plane lower than the first surface facing the process space, wherein the focus ring is substantially circular in shape, and
wherein the entire second surface of the focus ring contacts the upper surface of the substrate holder.

16. The processing system as recited in claim 15, wherein said one or more contact features comprises at least one of a radially extending groove in said second surface and an azimuthally extending groove in said second surface.

17. The processing system as recited in claim 16, wherein a cross-section of each of the one or more contact features comprises at least one of a square shape, a rectangular shape, a trapezoidal shape, a triangular shape, and a curved shape.

18. The processing system as recited in claim 15, wherein said clamping feature comprises a clamping surface configured to be coupled to said upper mating surface, and a fastening receptor configured to receive a fastening device and configured to couple said clamping feature to said substrate holder.

19. The processing system as recited in claim 18, wherein said upper mating surface and said clamping surface are at least one of vertical, horizontal, inclined, and declined surfaces.

20. The processing system as recited in claim 18, wherein said clamping surface further comprises a groove, said groove comprising at least one of a radially extending groove and an azimuthally extending groove.

21. The processing system as recited in claim 15, wherein said upper surface of said substrate holder further comprises a compliant member, said compliant member being coupled to said lower surface of said mating lip of said focus ring and said upper surface of said substrate holder.

22. The processing system as recited in claim 21, wherein said compliant element comprises at least one of an elastomer O-ring and a thin Teflon ring.

23. The processing system as recited in claim 15, wherein said mating of said one or more contact features with said one or more receiving features forms a contact space, said contact space being coupled to a gas supply.

24. The processing system as recited in claim 23, wherein said coupling to said gas supply comprises a gas line coupled to a gas distribution channel, said gas distribution channel coupled to said contact space through said one or more receiving features.

* * * * *